(12) United States Patent
Winoto

(10) Patent No.: US 9,432,032 B2
(45) Date of Patent: Aug. 30, 2016

(54) SAMPLE-RATE CONVERSION IN A MULTI-CLOCK SYSTEM SHARING A COMMON REFERENCE

(71) Applicant: Marvell World Trade Ltd., St. Michael (BB)

(72) Inventor: Renaldi Winoto, Danville, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 138 days.

(21) Appl. No.: 14/522,484

(22) Filed: Oct. 23, 2014

(65) Prior Publication Data

US 2015/0116014 A1    Apr. 30, 2015

Related U.S. Application Data

(60) Provisional application No. 61/895,024, filed on Oct. 24, 2013.

(51) Int. Cl.
*H03L 7/099*    (2006.01)

(52) U.S. Cl.
CPC ..................... *H03L 7/099* (2013.01)

(58) Field of Classification Search
CPC ........................................... H03L 7/099
USPC .......................................... 327/144
See application file for complete search history.

(56) References Cited

U.S. PATENT DOCUMENTS

| | | | | |
|---|---|---|---|---|
| 6,226,661 B1* | 5/2001 | Savell | ..................... | G10L 21/04 341/61 |
| 6,473,475 B1* | 10/2002 | Putzeys | ................ | H03H 17/028 341/61 |
| 2010/0033220 A1* | 2/2010 | Zhang | ..................... | H03L 7/085 327/159 |
| 2010/0085090 A1* | 4/2010 | Lin | .......................... | H03L 7/07 327/157 |
| 2013/0038365 A1* | 2/2013 | Gao | ........................ | H03L 7/091 327/157 |

FOREIGN PATENT DOCUMENTS

JP    2003-283338 A    10/2003

OTHER PUBLICATIONS

International Search Report and Written Opinion for PCT/US2014/062057, filed Oct. 23, 2014.

* cited by examiner

*Primary Examiner* — Ryan Jager

(57) ABSTRACT

A method comprises determining a reference ratio based on a first division ratio of a first phase-locked loop (PLL) and a second division ratio of a second PLL, and converting a first discrete sequence to a second discrete sequence based on a sequence of multiples of the reference ratio. The first and second PLLs operate under a locked condition and share a common reference oscillator. An apparatus includes comprises a clock generator including first and second phase-locked loops (PLLs) and configured to generate first and second clock signals, respectively, and a sample-rate converter configured to convert a first discrete sequence to a second discrete sequence based on a sequence of multiples of a reference ratio. The reference ratio is determined based on a first division ratio of the first PPL and a second division ratio of the second PLL.

20 Claims, 7 Drawing Sheets

SAMPLE-RATE CONVERSION IN A MULTI-CLOCK SYSTEM SHARING A COMMON REFERENCE

CROSS REFERENCE TO RELATED APPLICATION

This present disclosure claims the benefit of U.S. Provisional Application No. 61/895,024, filed on Oct. 24, 2013, which is incorporated by reference herein in its entirety.

BACKGROUND

Electronic devices that transmit and receive different types of signals, such as telecommunication systems, may include a plurality of signal processing circuits. When one signal processing circuit using a first sampling frequency transmits a digital signal to the other signal processing circuit using a second sampling frequency, sample-rate conversion is desirable to change the sampling rate of the digital signal from the first sampling frequency to the second sampling frequency.

A conventional approach to sample rate conversion includes converting a digital signal to an analog signal, and then re-sampling the analog signal at a new sampling rate to obtain a new digital signal. However, this approach usually uses a digital-to-analog converter (DAC) and an analog-to-digital converter (ADC), and thus often results in undesirable signal distortion and expensive manufacturing cost.

Another conventional approach to sample rate conversion includes upsampling a digital signal sampled at a first sampling frequency to an intermediate conversion frequency that corresponds to a least common multiple of the first sampling frequency and a second sampling frequency, and then downsampling the upsampled digital signal to the second sampling frequency. However, when a ratio of the first and second sampling frequencies is not a whole number, the intermediate conversion frequency is high, and as a result the sample-rate conversion is computationally inefficient.

SUMMARY

In an embodiment, a method comprises determining a reference ratio based on a first division ratio of a first phase-locked loop (PLL) and a second division ratio of a second PLL, and converting a first discrete sequence to a second discrete sequence based on a sequence of multiples of the reference ratio. The first and second PLLs operate under a locked condition and share a common reference oscillator.

In an embodiment, the method further comprises writing the first discrete sequence in a storage device in response to a first clock signal and reading out the first discrete sequence from the storage device in response to a second clock signal.

In an embodiment, the storage device is a memory device and the memory device is an asynchronous first in first out (FIFO) buffer.

In an embodiment, the method further comprises accumulating the reference ratio to generate the sequence of multiples of the reference ratio.

In an embodiment, converting the first discrete sequence to the second discrete sequence includes converting the first discrete sequence to an upsampled discrete sequence. The upsampled discrete sequence has a sampling frequency higher than the first discrete sequence.

In an embodiment, the sampling frequency of the upsampled discrete sequence is a multiple of the sampling frequency of the first discrete sequence.

In an embodiment, the sampling frequency of the upsampled discrete sequence is no more than fifteen times of the sampling frequency of the first discrete sequence.

In an embodiment, converting the first discrete sequence to the second discrete sequence further includes selecting two consecutive values of the upsampled discrete sequence. A multiple of the reference ratio lies between sampling times of the consecutive values of the upsampled discrete sequence.

In an embodiment, converting the first discrete sequence to the second discrete sequence further includes interpolating the consecutive values of the upsampled discrete sequence to generate a value of the second discrete sequence.

In an embodiment, the consecutive values of the upsampled discrete sequence are linearly interpolated.

In an embodiment, the common reference oscillator includes a crystal oscillator.

In an embodiment, the reference ratio is an integer or a fixed precision fractional number.

In an embodiment, an apparatus comprises a clock generator including first and second phase-locked loops (PLLs) and configured to generate first and second clock signals, respectively, and a sample-rate converter configured to convert a first discrete sequence to a second discrete sequence based on a sequence of multiples of a reference ratio. The reference ratio is determined based on a first division ratio of the first PPL and a second division ratio of the second PLL. The first and second PLLs operate under a locked condition and share a common reference oscillator.

In an embodiment, the sample-rate converter includes an asynchronous first in first out (FIFO) buffer.

In an embodiment, the sample-rate converter includes an accumulator configured to accumulate the reference ratio to generate the sequence of multiples of the reference ratio.

In an embodiment, the sample-rate converter further includes first and second interpolators configured to generate two consecutive values of a upsampled discrete sequence, respectively. The upsampled discrete sequence has a sampling frequency higher than the first discrete sequence.

In an embodiment, the sample-rate converter further includes a third interpolator configured to interpolate the consecutive values of the upsampled discrete sequence to generate a value of the second discrete sequence. A multiple of the reference ratio lies between sampling times of the consecutive values of the upsampled discrete sequence.

In an embodiment, the third interpolator is a linear interpolator.

In an embodiment, the common reference oscillator includes a crystal oscillator.

In an embodiment, the first and second PLLs include an integer-N PLL or a fractional-N PLL.

DETAILED DESCRIPTION

Figure 1A:
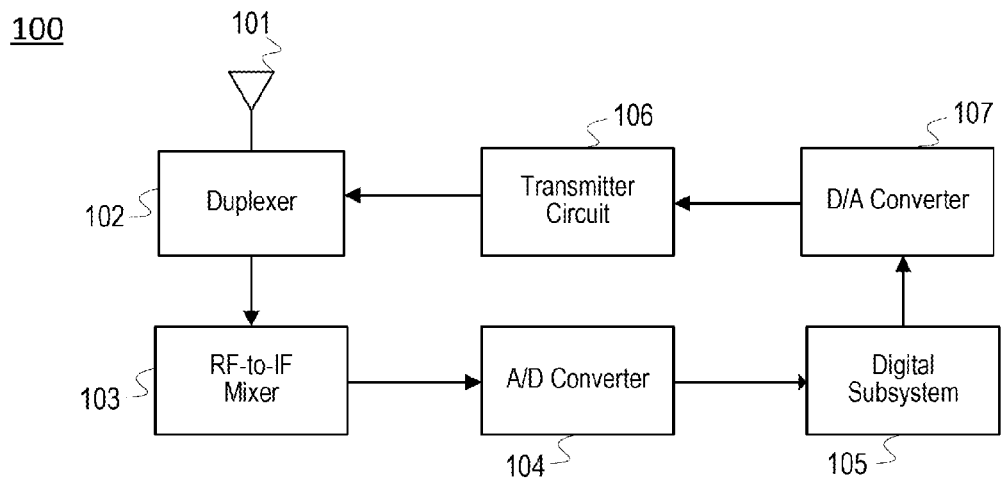
FIG. 1A shows a block diagram of a communication device according to an embodiment.

FIG. 1A shows a communication device 100 according to an embodiment. The communication device 100 includes an antenna 101, a duplexer 102, a radio frequency-to-intermediate frequency (RF-to-IF) mixer 103, an analog-to-digital (A/D) converter 104, a digital subsystem 105, a transmitter circuit 106, and a digital-to-analog (D/A) converter 107.

Upon receiving an RF signal by the antenna 101, the duplexer 102 directs the received RF signal to the RF-to-IF mixer 103, which converts the RF signal into an IF signal. The A/D converter 104 converts the IF signal into a digital signal and outputs the digital signal to the digital subsystem 105 to process the digital signal. The digital subsystem 105 provides an output digital signal to the D/A converter 107 to convert the output signal into an analog signal. The transmitter circuit 106 processes the analog signal for radio transmission via the antenna 101 through the duplexer 102.

While FIG. 1A shows a wireless communication device 100 coupled to the antenna 101, embodiments are not limited thereto. The device 100 may be any type of a communication device including a digital signal processing system. In an embodiment, the communication device 100 is coupled to a coaxial cable, twisted pair, stripline, printed-circuit board trace, or other form of wired communication channel. In another embodiment, the communication device 100 is coupled to an optoelectronic device, such as a laser diode or optical modulator, which may be coupled to an optical communication channel.

Figure 1B:
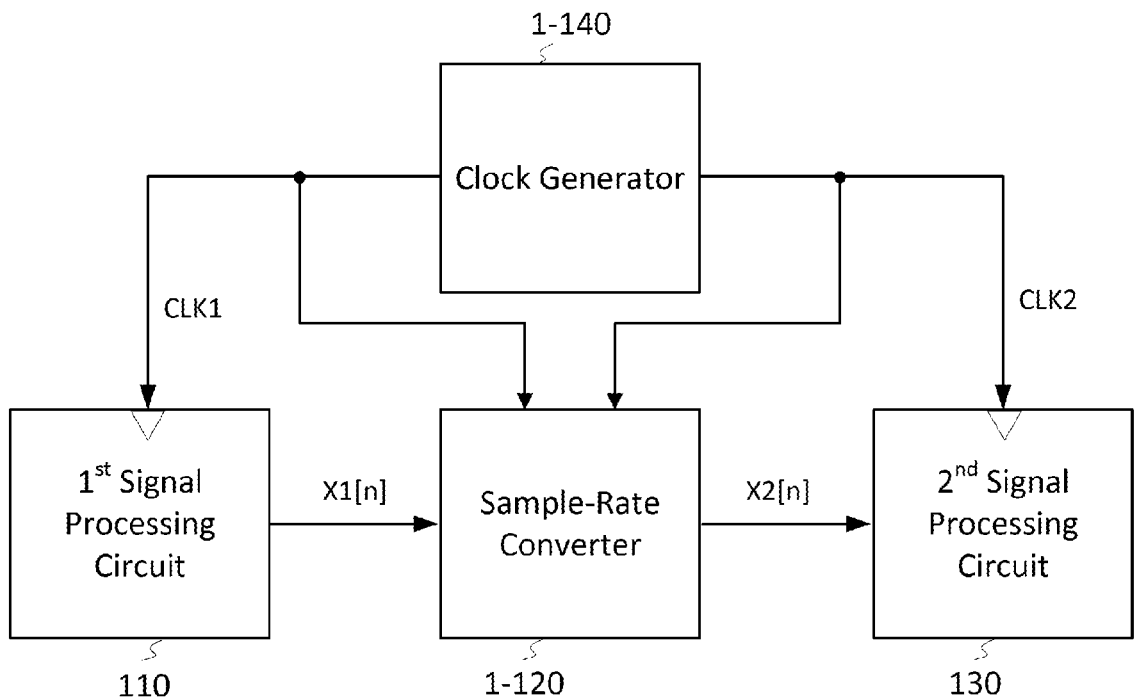
FIG. 1B is a block diagram of a portion of a digital subsystem shown in FIG. 1A according to an embodiment

FIG. 1B is a block diagram of a portion of the digital subsystem 105 shown in FIG. 1A according to an embodiment. The digital subsystem 105 includes a first signal processing circuit 110, a sample-rate converter 1-120, a second signal processing circuit 130, and a clock generator 1-140.

The first signal processing circuit 110 receives a first clock signal CLK1 and samples a continuous signal at a first sampling frequency of the first clock signal CLK1. The first signal processing circuit 110 transmits a first discrete sequence x1[n] to a sample-rate converter 1-120. In an embodiment, the first signal processing circuit 110 includes a baseband processor.

The sample-rate converter 1-120 receives the first discrete sequence x1[n] and changes the sampling rate from the first sampling frequency to a second sampling frequency of a second clock signal CLK2. As a result, the sample-rate converter 1-120 generates a second discrete sequence x2[n], which is a new discrete representation of the continuous signal according to the second sampling frequency.

The second signal processing circuit 130 receives the second discrete sequence x2[n] to process the received sequence x2[n] using the second clock signal CLK2. In an embodiment, the second signal processing circuit 130 includes a circuit element in a radio-frequency (RF) section of a transceiver, which operates at a carrier frequency in a range of 2.4~2.5 GHz.

The clock generator 1-140 provides a plurality of clock signals including the first and second clock signals CLK1 and CLK2. In an embodiment, the clock generator 1-140 includes a plurality of phase-locked loops (PLLs) that share a common reference oscillator, as will be described in detail with reference to FIG. 3.

Figure 2:
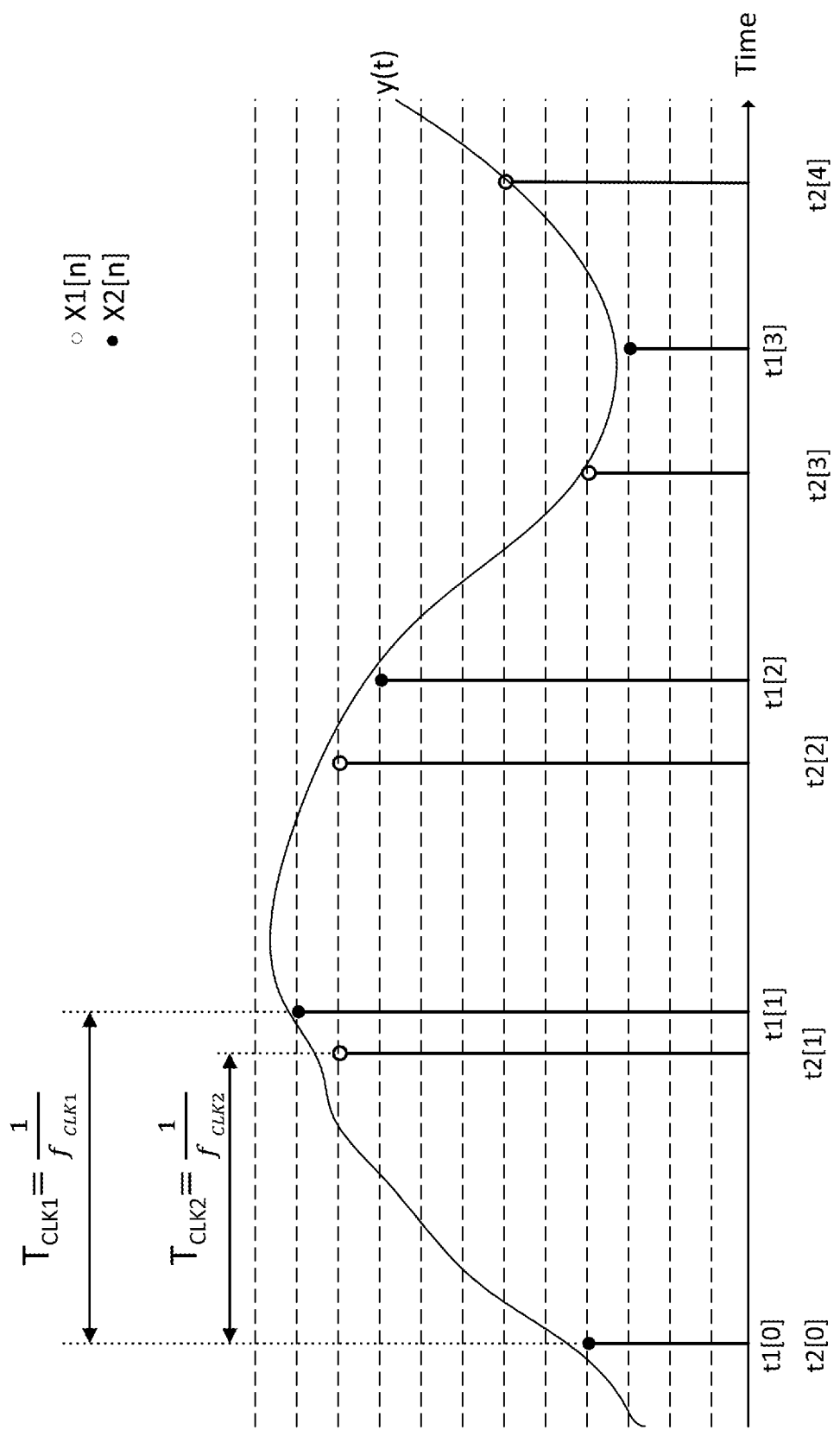
FIG. 2 illustrates first and second discrete sequences corresponding to a continuous signal, according to an embodiment.

FIG. 2 illustrate first and second discrete sequences x1[n] and x2[n] corresponding to a continuous signal y(t), according to an embodiment. In FIG. 2, the first sampling time t1[0] of the first discrete sequence x1[n] corresponds to the first sampling time t2[0] of the second discrete sequence x2[n] for illustrative convenience.

The first discrete sequence x1[n] is a sequence of quantized and sampled values of the continuous signal y(t) with a time spacing equal to a first sampling period $T_{CLK1}$, which is a reciprocal of a first sampling frequency $f_{CLK1}$. The second discrete sequence x2[n] is a sequence of quantized and sampled values of the continuous signal y(t) with a time spacing equal to a second sampling period $T_{CLK2}$, which is a reciprocal of a second sampling frequency $f_{CLK2}$. In an embodiment, the first sampling frequency $f_{CLK1}$ is lower than the second sampling frequency $f_{CLK2}$, so that the first sampling period $f_{CLK1}$ is longer than the second sampling period $T_{CLK2}$ as illustrated in FIG. 2.

Figure 3:
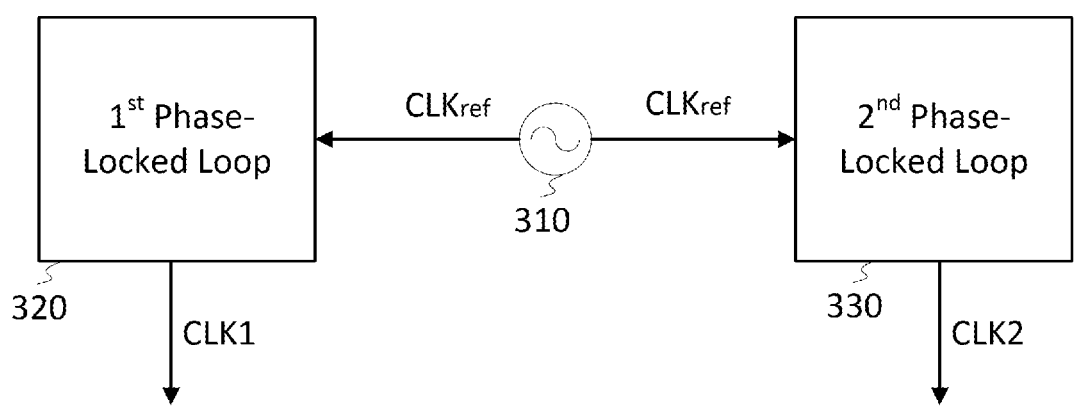
FIG. 3 is a block diagram of a clock generator shown in FIG. 1 according to an embodiment.

FIG. 3 is a block diagram of a clock generator suitable for use as the clock generator 1-140 of FIG. 1 according to an embodiment. In the embodiment shown in FIG. 3, first and second PLLs 320 and 330 share a common reference oscillator 310. In another embodiment, first and second delay locked loops (DLLs) are used instead of the first and second PLLs 320 and 330.

The common reference oscillator 310 generates a reference clock signal $CLK_{ref}$ and transmits the reference clock signal $CLK_{ref}$ to the first and second PLLs 320 and 330. The reference clock signal $CLK_{ref}$ has a reference frequency $f_{ref}$. In an embodiment, the common reference oscillator 310 is a crystal oscillator.

The first PLL 320 receives the reference clock signal $CLK_{ref}$ as an input signal and generates a first clock signal CLK1 as an output signal. Under locked condition, the input signal $CLK_{ref}$ and the output signal CLK1 of the first PLL 320 bears an exact relationship with each other. As a result, where $k_1$ denotes a first division ratio of the first PLL 320, the frequency $f_{CLK1}$ of the first clock signal CLK1 is related to the reference frequency $f_{ref}$ of the reference clock signal $CLK_{ref}$ as follows:

$$f_{CLK1} = f_{REF} * k_1 \qquad \text{Equation 1.}$$

In an embodiment, the first PLL 320 is an integer-N PLL in which the first division ratio $k_1$ has an integer value. In another embodiment, the first PLL 320 is a fractional-N PLL in which the first division ratio $k_1$ is a fractional value $d_1/n_1$, where $d_1$ and $n_1$ are relatively prime integers.

The second PLL 330 receives the reference clock signal $CLK_{ref}$ as an input signal and generates a second clock signal CLK2 as an output signal. Under locked condition, the input signal $CLK_{ref}$ and the output signal CLK2 of the second PLL 330 bears an exact relationship with each other. As a result, where $k_2$ denotes a second division ratio of the second PLL 330, the frequency $f_{CLK2}$ of the second clock signal CLK2 is related to the frequency $f_{ref}$ of the reference clock signal $CLK_{ref}$ as follows:

$$f_{CLK2} = f_{RE} * k_2 \qquad \text{Equation 2.}$$

In an embodiment, the second PLL 330 is an integer-N PLL in which the second division ratio $k_2$ has an integer value. In another embodiment, the second PLL 330 is a fractional-N PLL in which the second division ratio $k_2$ is a fractional value $d_2/n_2$, where $d_2$ and $n_2$ are relatively prime integers.

A reference ratio k is determined based on the frequencies $f_{CLK1}$ and $f_{CLK2}$ of the first and second PLLs 320 and 330, respectively. In an embodiment, the reference ratio k is a ratio between the frequencies $f_{CLK1}$ and $f_{CLK2}$ of the first and second PLLs 320 and 330 and is represented as follows using Equations 1 and 2:

$$k = \frac{f_{CLK1}}{f_{CLK2}} = \frac{k_1}{k_2}. \qquad \text{Equation 3A}$$

When the first and second division ratios $k_1$ and $k_2$ are fractional values $d_1/n_1$ and $d_2/n_2$, respectively, the reference ratio k between the frequencies $f_{CLK1}$ and $f_{CLK2}$ of the first and second PLLs 320 and 330 is represented as:

$$k = \frac{f_{CLK1}}{f_{CLK2}} = \frac{k_1}{k_2} = \frac{d_1 \cdot n_2}{d_2 \cdot n_1}. \qquad \text{Equation 3B}$$

Thus, in an embodiment, the reference ratio k is either an integer or a fixed precision fractional number.

In an embodiment, at least one of the first and second frequencies $f_{CLK1}$ and $f_{CLK2}$ is generated using a frequency divider in addition to the first and second PLLs 320 and 330, respectively. The frequency divider divides the frequency $f_{ref}$ of the reference clock signal $CLK_{ref}$ by an integer N to produce an offset frequency $f_{off}$ equal to $f_{ref}/N$. The offset frequency $f_{off}$ is combined with a multiple M of the reference clock signal $CLK_{ref}$ to produce a clock frequency equal to $f_{ref}*M+f_{ref}/N$, a clock frequency equal to $f_{ref}*M-f_{ref}/N$, or both. A person of skill in the art in light of the teachings and disclosures herein would understand how to calculate a reference ratio k between the frequencies $f_{CLK1}$ and $f_{CLK2}$ in such an embodiment.

When either of the first and second PLLs 320 and 330 is susceptible to phase noise or jitter, which may result from PLL components including one or more of a phase detector, a low-pass filter, a voltage controlled oscillator, and a frequency divider, the respective frequencies $f_{CLK1}$ and $f_{CLK2}$ may vary. On the other hand, when the first and second PLLs 320 and 330 share the common reference oscillator 310 and operate under the locked condition, since the first and second division ratios $k_1$ and $k_2$ have fixed values, the reference ratio k between the division ratios $k_1$ and $k_2$ also has a fixed value. The value of the reference ratio k is used to determine sampling times of an output discrete sequence x2[n] of the sample-rate converter 1-120 of FIG. 1, as will be described below in detail.

In an embodiment, one or both of the frequencies $f_{CLK1}$ and $f_{CLK2}$ of the first and second PLLs 320 and 330, and accordingly the first and second division ratios $k_1$ and $k_2$, may vary. For example, in an embodiment, the first PLL 320 generates a clock for a baseband circuit that has a substantially fixed nominal frequency of 300 MHz, and the second PLL 330 generates a clock for a radio frequency (RF) circuit that has a frequency that varies between 2.412 and 2.482 GHz according to a selection of a channel. As a result, the reference ratio k may be recomputed when one or more of the first and second division ratios $k_1$ and $k_2$ change.

Figure 4:
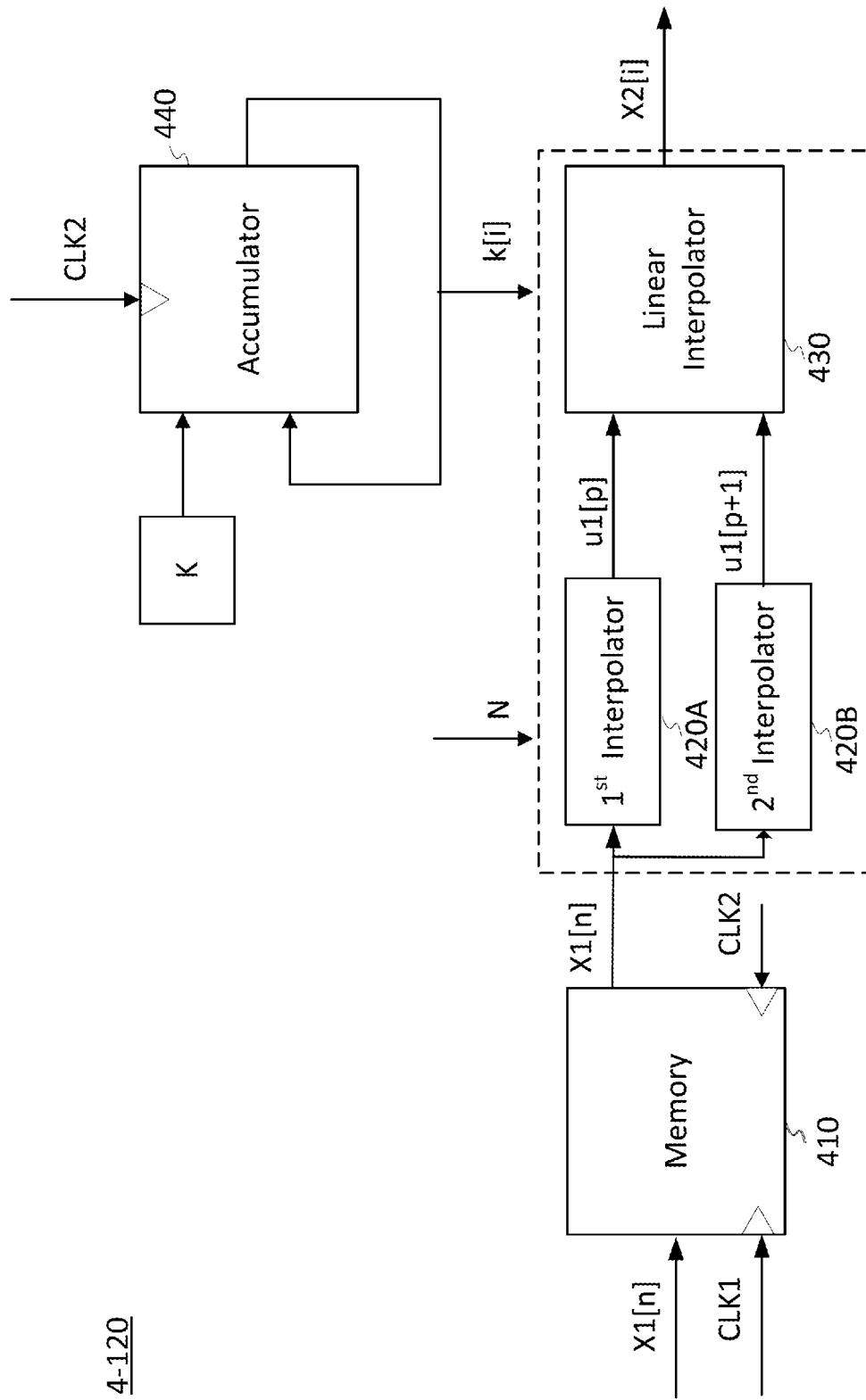
FIG. 4 is a block diagram of a sample-rate converter shown in FIG. 1 according to an embodiment.

FIG. 4 is a block diagram of a sample-rate converter 4-120 suitable for the sample-rate converter 1-120 shown in FIG. 1 according to an embodiment. The sample-rate converter 4-120 includes an accumulator 440, a two-step interpolator 450, and a first in first out (FIFO) buffer 410.

The accumulator 440 receives a second clock signal CLK2 and a value of a reference ratio k between first and second division ratios $k_1$ and $k_2$ of first and second PLLs. In response to the second clock signal CLK2, the accumulator 440 adds the received value of the reference ratio k to a value that has been previously stored in the accumulator 440, stores the added value in the accumulator 440, and outputs the added value to the two-step interpolator 450. In an embodiment, the accumulator 440 outputs a sequence k[i] of multiples of the ratio k, for example, 0, k, 2k, 3k, and the like.

Figure 5A:
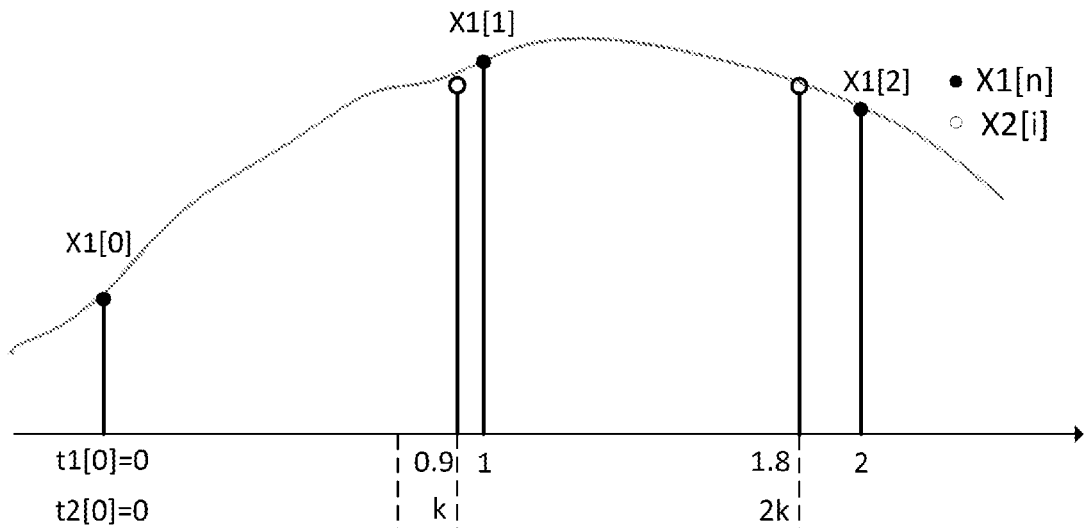
FIGS. 5A and 5B illustrate upsampling and interpolation of a sample-rate converter shown in FIG. 1 according to an embodiment.

FIG. 5A illustrates a portion of the first and second discrete sequence x1[n] and x2[n] of FIG. 2 as a function of sampling times, which are normalized by the first sampling period $T_{CLK1}$ of the first discrete sequence x1[n]. Assuming the first sampling time t1[0] of the first discrete sequence x1[n] corresponds to the first sampling time t2[0] of the second discrete sequence x2[i], values of the sequence k[i] of multiples of k correspond to the consecutive sampling positions of the second discrete sequence x2[i] relative to the samples in the first discrete sequence x1[n], as illustrated in FIG. 5A.

Referring back to FIG. 4, the two-step interpolator 450 receives the first discrete signal x1[n] to generate the second discrete signal x2[i] based on the sequence k[i] of the accumulator 440. The two-step interpolator 450 includes first and second interpolators 420A and 420B and a linear interpolator 430 (or a third interpolator 430).

Figure 5B:
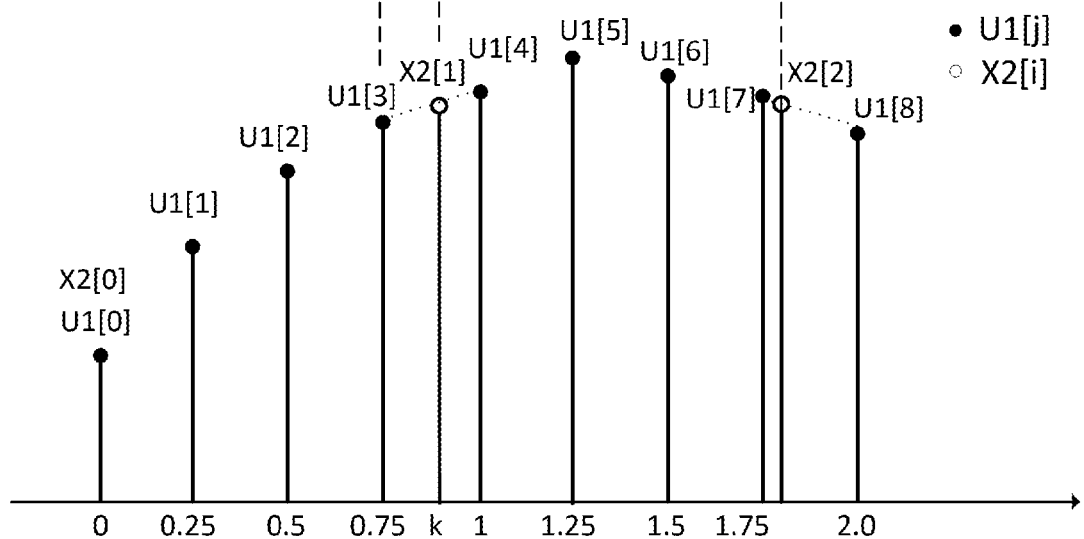

The first and second interpolators 420A and 420B receive a plurality of members of the first discrete sequence x1[n], a predetermined number N, and the sequence k[n] to respectively output first and second selected values u1[p] and u1[p+1] of an upsampled discrete sequence u1[j], which has a sampling frequency equal to the sampling frequency $f_{clk1}$ of the first discrete sequence x1[n] multiplied by a positive integer number N. The first and second selected values u1[p] and u1[p+1] are consecutive values of the upsampled discrete sequence u1[j]. The received value of the sequence k[i] indicates a time between the sampling times corresponding to these consecutive values u1[p] and u[p+1] of the upsampled discrete sequence u1[j]. In an embodiment, the predetermined number N is a positive integer that is equal to or less than 15. For example, FIG. 5B shows the upsampled discrete sequence u1[j], which has the sampling frequency four times (i.e., N=4) higher than the frequency $f_{clk1}$ of the first discrete sequence x1[n].

In an embodiment, the index p of the first selected value u1[p] is determined according to the following equation:

$$p = \lfloor N*k[i] \rfloor \qquad \text{Equation 4,}$$

where $\lfloor \ \rfloor$ is a floor function, and N is an upsampling ratio. For example, when the received value of the sequence k[i]=0.9 and the upsampling ratio N is 4, the index p of the first selected value u1[p] is equal to 3 (=$\lfloor 4*0.9 \rfloor$). Thus, the first selected value u1[p] corresponds to the fourth member u1[3] of the upsampled discrete sequence u1[j]. As a result, the second selected value u1[p+1] corresponds to the fifth member u1[4] of the upsampled discrete sequence u1[j].

The first interpolator 420A interpolates the first discrete sequence x1[n] to generate the first selected value u1[p]. The second interpolator 420B interpolates the first discrete sequence x1[n] to generate the second selected value u1[p+1]. In an embodiment, the first interpolator 420A and the second interpolator 420B have substantially the same configuration. In an embodiment, interpolation is performed using zero-padding and low pass filtering.

The linear interpolator 430 receives the consecutive values u1[p] and u1[p+1] of the upsampled discrete sequence and a value of the sequence k[n] and linearly interpolates the consecutive values u1[p] and u1[p+1] to generate the second discrete sequence x2[i]. In an embodiment illustrated in FIG. 5B, a value of the second member x2[1] of the second discrete sequence x2[i] between two consecutive values u1[3] and u1[4] of the upsampled discrete sequence is calculated as follows:

$$x2[1]=(1-\alpha)*u1[3]+\alpha*u1[4] \quad \text{Equation 5,}$$

where $\alpha$ is a weighting factor for linear interpolation. In this embodiment, the weighting factor $\alpha$ is calculated according to the following equation:

$$\alpha = N*k[i]-p \quad \text{Equation 6,}$$

where N is an upsampling ratio and p is the index of the first selected value u1[p]. For example, when the received value of the sequence k[i] is 0.9, the upsampling ratio N is 4, and the index p of the first selected value u1[p] is equal to 3 as illustrated in FIG. 5A, the weighting factor $\alpha$ is equal to 0.6 (=4*0.9−3). As a result, the value of the second member x2[1] the second discrete sequence x2[i] is 0.4*u1[3]+0.6*u1[4]. When the received value of the sequence k[i] is 1.8, the upsampling ratio N is 4, and the index p of the first selected value u1[p] is equal to 7 as illustrated in FIG. 5A, the weighting factor $\alpha$ is equal to 0.2 (=4*1.8−7). As a result, the value of the third member x2[2] of the second discrete sequence x2[i] is 0.8*u1[7]+0.2*u1[8].

Referring back to FIG. 4, the FIFO buffer 410 receives the first and second clock signals CLK1 and CLK2 and the first discrete sequence x1[n] to manage data flow into the two-step interpolator 450. In an embodiment, the FIFO buffer 410 writes the first discrete sequence x1[n] into the FIFO buffer 410 and reads the same sequence x1[n] out based on the first and second clock signals CLK1 and CLK2 to prevent data overflow or underflow. A person of skill in the art in light of the teachings and disclosures herein would understand how to implement the FIFO buffer 410.

Figure 6:
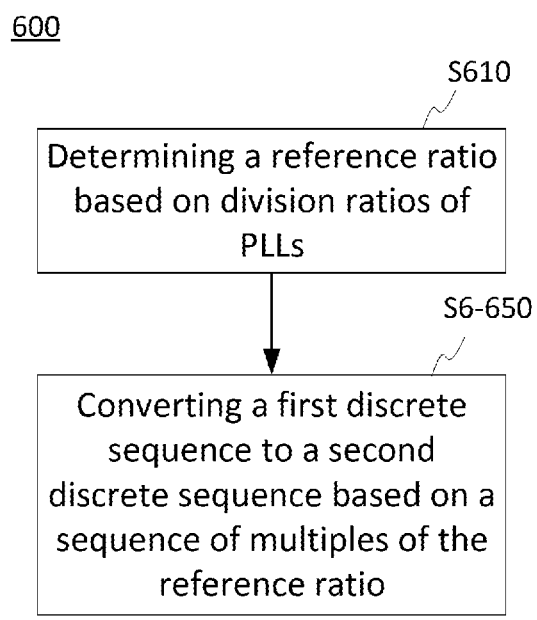
FIG. 6 is a flowchart of a process of sample-rate conversion according to an embodiment.

FIG. 6 is a flowchart of a process of sample-rate converting according to an embodiment.

At S610, a reference ratio is determined based on two division ratios of first and second PLLs, which shares a common reference oscillator to respectively generate first and second clock signals under locked condition. Under the locked condition, the reference ratio between the division ratios is maintained substantially constant. In an embodiment, the reference ratio is a ratio between the division ratios.

At S6-650, a first discrete sequence obtained by sampling a continuous signal at a first frequency of the first clock signal is converted to a second discrete sequence based on a sequence of multiples of the reference ratio between the division ratios of the PLLs. The second discrete sequence is equivalent to a signal obtained by sampling the continuous signal at a second frequency of the second clock signal.

Figure 7:
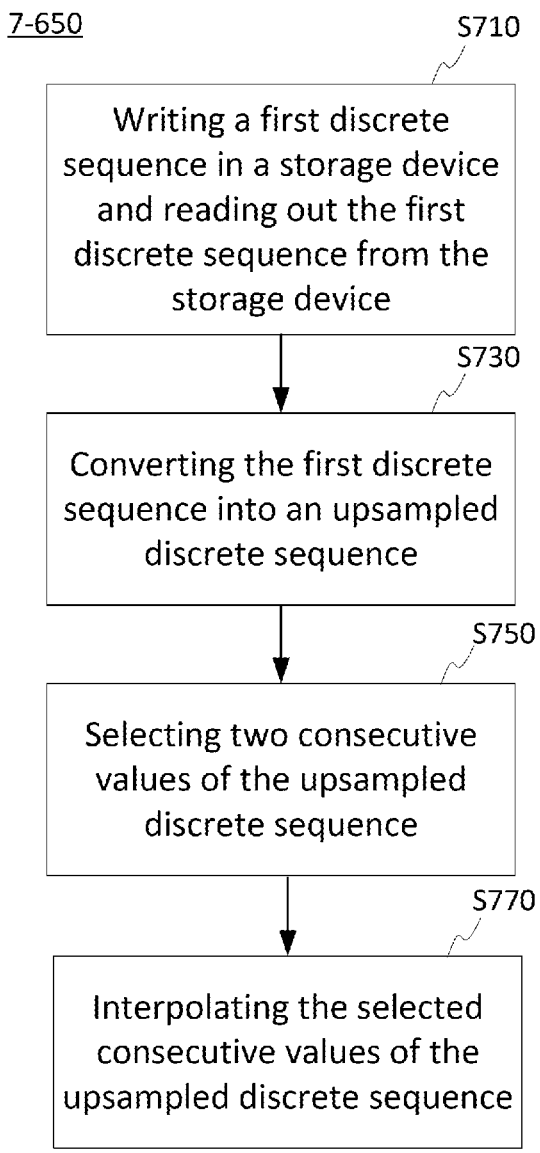
FIG. 7 illustrates a process of converting a first discrete sequence to a second discrete sequence according to an embodiment.

FIG. 7 illustrates a process 7-650 of converting a first discrete sequence to a second discrete sequence according to an embodiment.

At S710, writing the first discrete sequence in a storage device (e.g., a memory device) and reading out the same sequence out from the storage device based on first and second clock signals are performed to prevent data overflow and/or underflow. In an embodiment, the storage device a memory device in a form of an asynchronous FIFO buffer.

At S730, the first discrete sequence is converted to an upsampled discrete sequence, which has a sampling frequency equal to the sampling frequency of the first discrete sequence multiplied by a positive integer number. In an embodiment, the positive integer number is equal to or less than 15.

At S750, two consecutive values (or first and second selected values) of the upsampled discrete sequence are selected such that the consecutive values correspond to consecutive sampling times of the upsampled discrete sequence between which a multiple of the reference ratio lies.

At S770, the selected consecutive values of the upsampled discrete sequence are interpolated to obtain a corresponding value of the second discrete sequence. In an embodiment, the selected consecutive values are linearly interpolated.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A method comprising:
   determining a reference ratio based on a first division ratio of a first phase-locked loop (PLL) and a second division ratio of a second PLL; and
   converting a first discrete sequence to a second discrete sequence based on a sequence of multiples of the reference ratio,
   wherein the first and second PLLs operate under a locked condition and share a common reference oscillator.

2. The method of claim 1, further comprising:
   writing the first discrete sequence in a storage device in response to a first clock signal; and
   reading out the first discrete sequence from the storage device in response to a second clock signal.

3. The method of claim 2, wherein the storage device is a memory device, the memory device being an asynchronous first in first out (FIFO) buffer.

4. The method of claim 1, further comprising:
   accumulating the reference ratio to generate the sequence of multiples of the reference ratio.

5. The method of claim 1, wherein converting the first discrete sequence to the second discrete sequence includes:
   converting the first discrete sequence to an upsampled discrete sequence, the upsampled discrete sequence having a sampling frequency higher than the first discrete sequence.

6. The method of claim 5, wherein the sampling frequency of the upsampled discrete sequence is a multiple of the sampling frequency of the first discrete sequence.

7. The method of claim 6, wherein the sampling frequency of the upsampled discrete sequence is no more than fifteen times of the sampling frequency of the first discrete sequence.

8. The method of claim 5, wherein converting the first discrete sequence to the second discrete sequence further includes selecting two consecutive values of the upsampled discrete sequence, and
   wherein a multiple of the reference ratio lies between sampling times of the consecutive values of the upsampled discrete sequence.

9. The method of claim 8, wherein converting the first discrete sequence to the second discrete sequence further includes:
  interpolating the consecutive values of the upsampled discrete sequence to generate a value of the second discrete sequence.

10. The method of claim 9, wherein the consecutive values of the upsampled discrete sequence are linearly interpolated.

11. The method of claim 1, wherein the common reference oscillator includes a crystal oscillator.

12. The method of claim 1, wherein the reference ratio is an integer or a fixed precision fractional number.

13. An apparatus comprising:
  a clock generator including first and second phase-locked loops (PLLs) and configured to generate first and second clock signals, respectively; and
  a sample-rate converter configured to convert a first discrete sequence to a second discrete sequence based on a sequence of multiples of a reference ratio, the reference ratio being determined based on a first division ratio of the first PPL and a second division ratio of the second PLL,
  wherein the first and second PLLs operate under a locked condition and share a common reference oscillator.

14. The apparatus of claim 13, wherein the sample-rate converter includes an asynchronous first in first out (FIFO) buffer.

15. The apparatus of claim 13, wherein the sample-rate converter includes an accumulator configured to accumulate the reference ratio to generate the sequence of multiples of the reference ratio.

16. The apparatus of claim 15, wherein the sample-rate converter further includes first and second interpolators configured to generate two consecutive values of a upsampled discrete sequence, respectively, the upsampled discrete sequence having a sampling frequency higher than the first discrete sequence.

17. The apparatus of claim 16, wherein the sample-rate converter further includes a third interpolator configured to interpolate the consecutive values of the upsampled discrete sequence to generate a value of the second discrete sequence, and
  wherein a multiple of the reference ratio lies between sampling times of the consecutive values of the upsampled discrete sequence.

18. The apparatus of claim 17, wherein the third interpolator is a linear interpolator.

19. The apparatus of claim 13, wherein the common reference oscillator includes a crystal oscillator.

20. The apparatus of claim 13, wherein the first and second PLLs include an integer-N PLL or a fractional-N PLL.

* * * * *